United States Patent
Ando et al.

(10) Patent No.: US 10,957,742 B2
(45) Date of Patent: Mar. 23, 2021

(54) RESISTIVE RANDOM-ACCESS MEMORY ARRAY WITH REDUCED SWITCHING RESISTANCE VARIABILITY

(71) Applicant: International Business Machines Corporation, Armonk, NY (US)

(72) Inventors: Takashi Ando, Tuckahoe, NY (US); ChoongHyun Lee, Rensselaer, NY (US); Seyoung Kim, Westchester, NY (US); Wilfried Haensch, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/539,518

(22) Filed: Aug. 13, 2019

(65) Prior Publication Data
US 2019/0371857 A1     Dec. 5, 2019

Related U.S. Application Data

(62) Division of application No. 15/977,117, filed on May 11, 2018, now Pat. No. 10,497,752.

(51) Int. Cl.
*H01L 27/24* (2006.01)
*H01L 45/00* (2006.01)
*G11C 13/00* (2006.01)

(52) U.S. Cl.
CPC ........ *H01L 27/249* (2013.01); *G11C 13/0007* (2013.01); *H01L 45/1233* (2013.01); *H01L 45/1253* (2013.01); *H01L 45/146* (2013.01); *H01L 45/1683* (2013.01); *G11C 13/004* (2013.01); *G11C 13/0069* (2013.01); *G11C 13/0097* (2013.01); *G11C 2013/005* (2013.01); *G11C 2013/009* (2013.01); *G11C 2213/15* (2013.01); *G11C 2213/32* (2013.01); *G11C 2213/71* (2013.01)

(58) Field of Classification Search
CPC .......... H01L 27/1128; H01L 27/11514; H01L 27/11551–11553; H01L 27/11578–11582; H01L 27/11597; H01L 45/1233
See application file for complete search history.

(56) References Cited

U.S. PATENT DOCUMENTS 8,891,277 B2 * 11/2014 Murooka ........... G11C 13/0007
                                                   365/63
9,564,587 B1 * 2/2017 Jo ....................... H01L 45/085
9,627,009 B2   4/2017 Petti
(Continued)

OTHER PUBLICATIONS

Prof. Dr. Rainer Waser, "Integration of TiO2 into Nano-Crossbar Arrays with 100 nm Half Pitch for Resistive RAM Applications," http://www.emrl.de/r_a_1.html, downloaded May 8, 2018, 15 pages.
(Continued)

*Primary Examiner* — Stephen M Bradley
(74) *Attorney, Agent, or Firm* — Randall Bluestone; Ryan, Mason & Lewis, LLP

(57) ABSTRACT

Devices and methods are provided to construct resistive random-access (RRAM) array structures which comprise RRAM memory cells, wherein each RRAM memory cell is formed of multiple parallel-connected RRAM devices to reduce the effects of resistive switching variability of the RRAM memory cells.

20 Claims, 12 Drawing Sheets

(56) References Cited

U.S. PATENT DOCUMENTS

| | | |
|---|---|---|
| 9,633,723 B2 | 4/2017 | Nguyen et al. |
| 9,647,037 B2 | 5/2017 | Lu et al. |
| 9,768,379 B2 | 9/2017 | Gassilloud et al. |
| 2012/0261638 A1 | 10/2012 | Sills et al. |
| 2013/0009122 A1 | 1/2013 | Park et al. |
| 2013/0210211 A1* | 8/2013 | Vereen .................. H01L 27/249 438/382 |
| 2013/0285203 A1 | 10/2013 | Hiroi et al. |
| 2014/0252295 A1 | 9/2014 | Liao et al. |
| 2015/0060992 A1 | 3/2015 | Taekyung et al. |
| 2016/0064453 A1 | 3/2016 | Hou et al. |
| 2016/0225823 A1 | 8/2016 | Wang et al. |
| 2017/0263682 A1* | 9/2017 | Komura ................ H01L 27/249 |
| 2018/0019392 A1 | 1/2018 | Lee et al. |
| 2018/0374899 A1 | 12/2018 | Yoshida et al. |
| 2019/0088717 A1* | 3/2019 | Yeh .................... H01L 45/1206 |

OTHER PUBLICATIONS

H.-S. Philip Wong et al., "Metal-Oxide RRAM," Proceedings of the IEEE, Jun. 2012, pp. 1951-1970, vol. 100, No. 6.

I.G. Baek et al., "Realization of Vertical Resistive Memory (VRRAM) Using Cost Effective 3D Process," IEEE International Electron Devices Meeting (IEDM), Dec. 2011, pp. 737-740.

List of IBM Patents or Patent Applications Treated as Related.

* cited by examiner

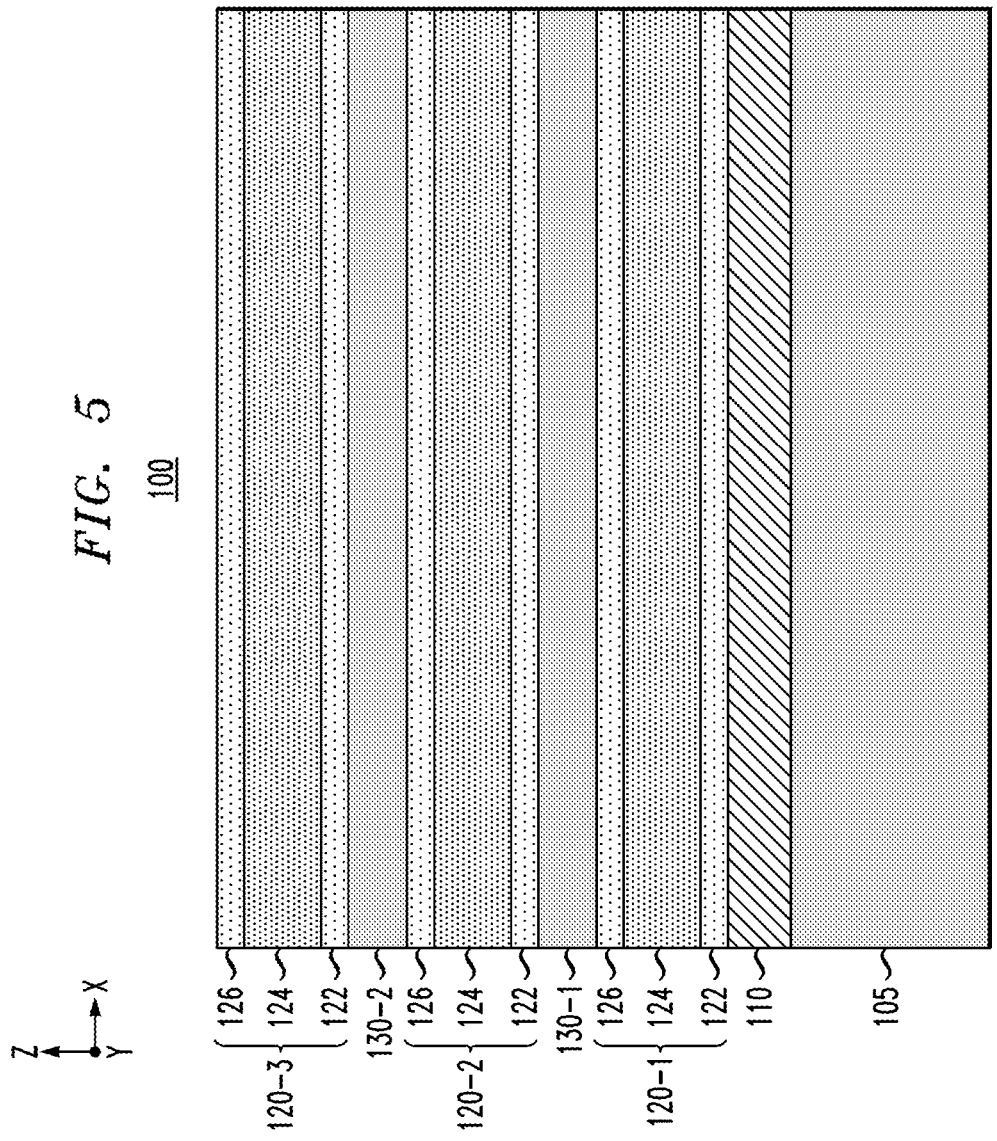

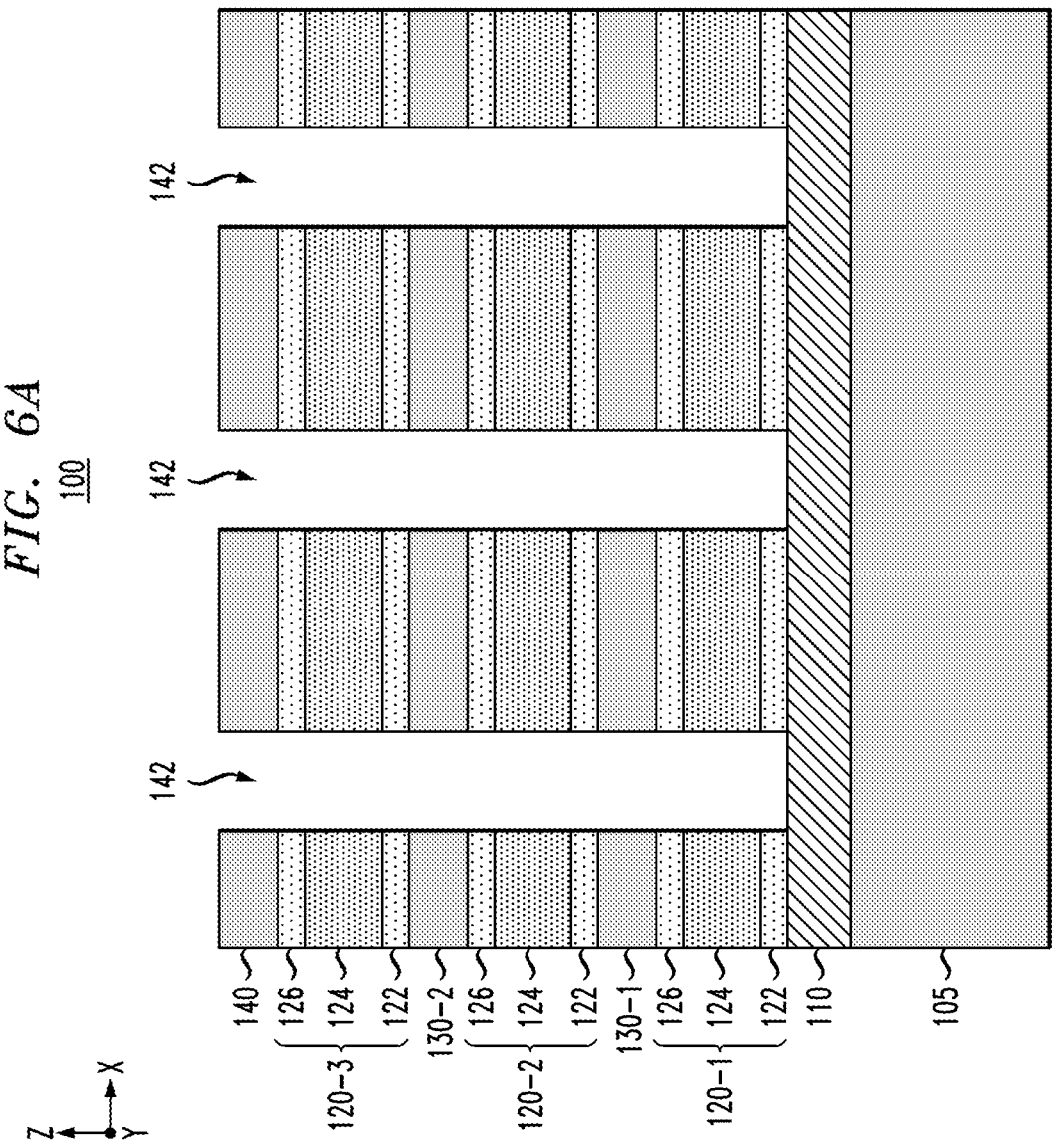

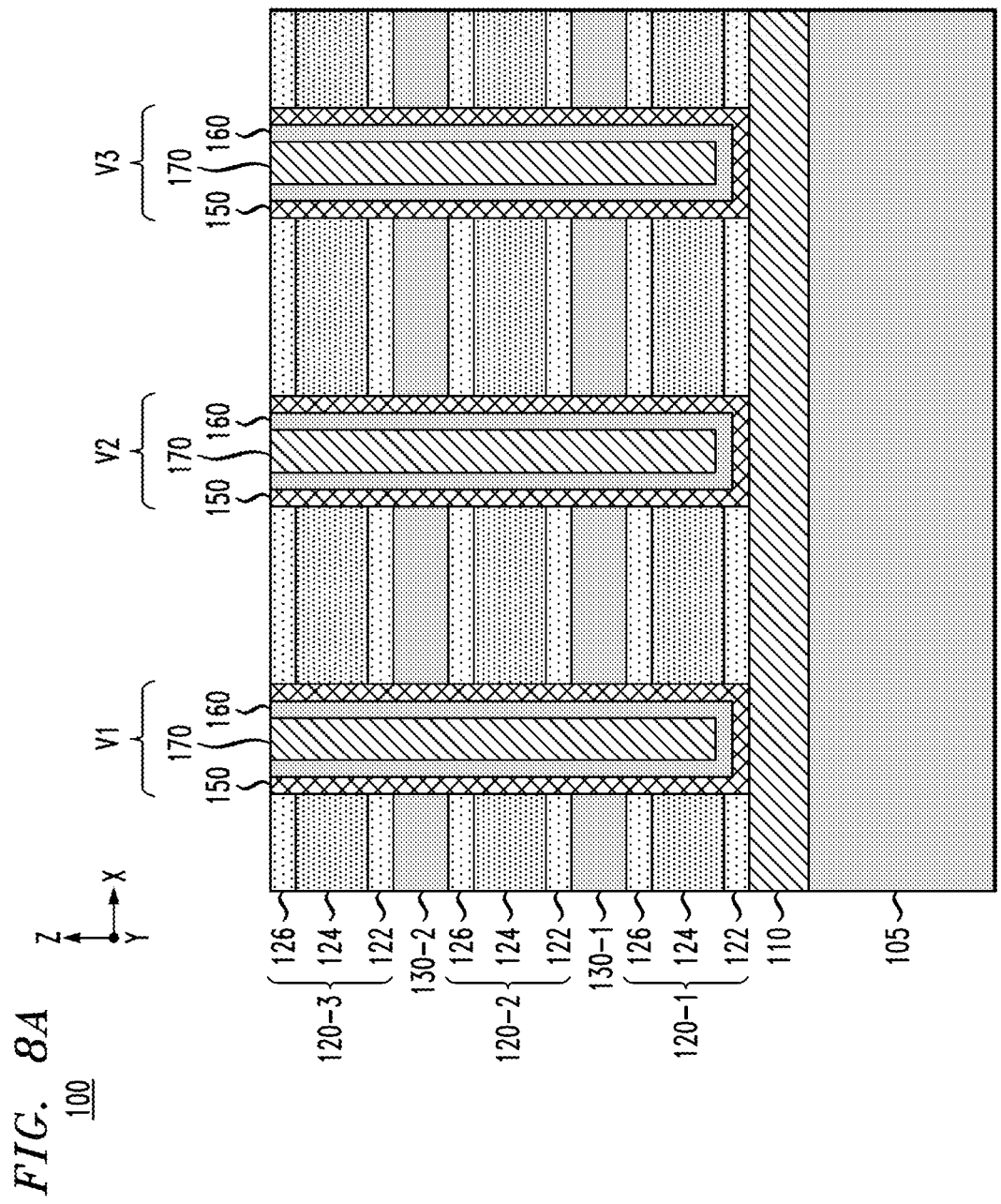

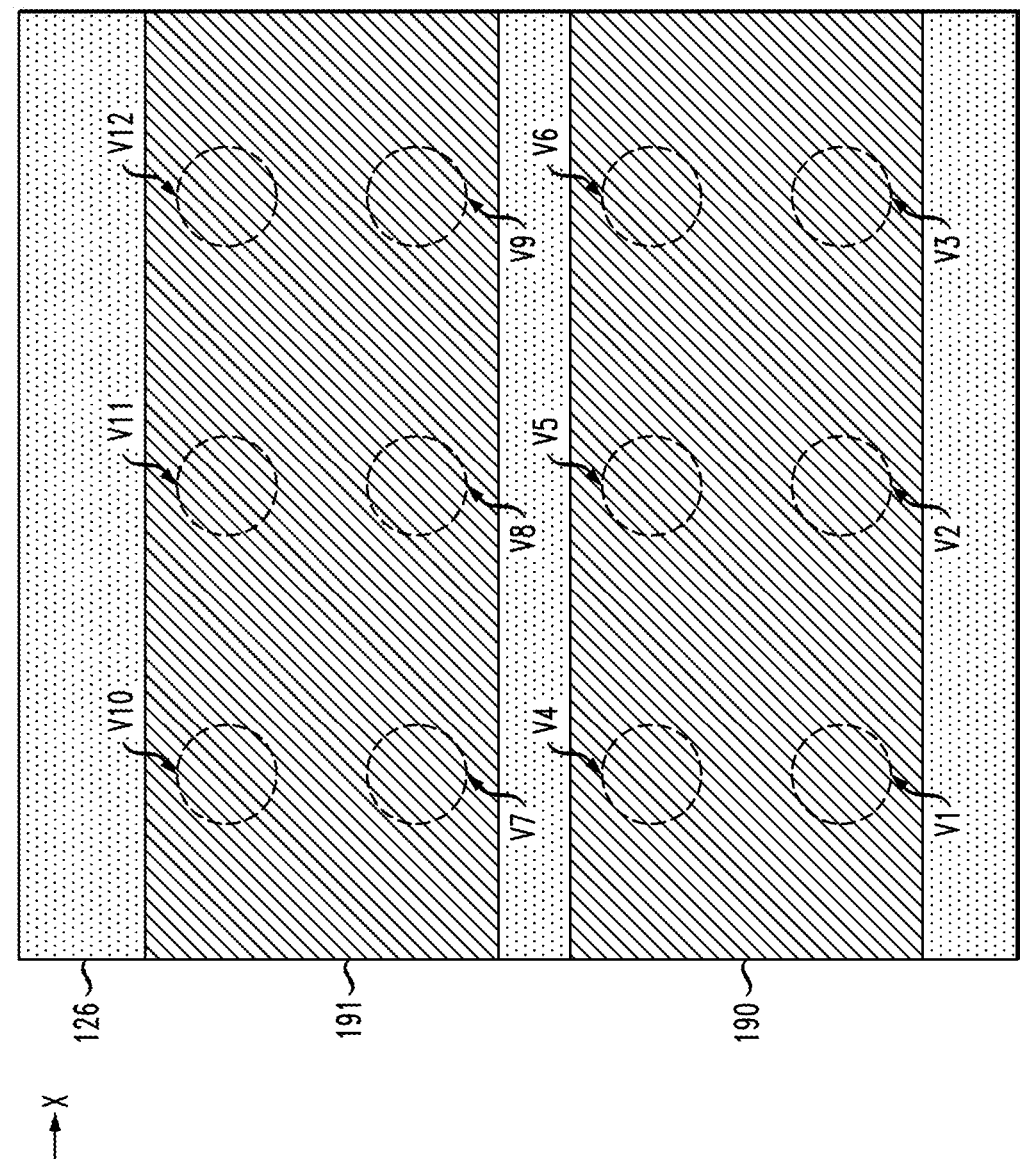

RESISTIVE RANDOM-ACCESS MEMORY ARRAY WITH REDUCED SWITCHING RESISTANCE VARIABILITY

TECHNICAL FIELD

This disclosure generally relates to semiconductor fabrication techniques and, in particular, resistive random-access memory arrays, and methods for fabricating resistive random-access memory arrays.

BACKGROUND

A resistive random-access memory (RRAM) is one type of non-volatile memory device which comprises a plurality of memory cells that maintain stored data when power is not supplied. RRAM is considered a promising candidate for next-generation nonvolatile memory, due to various advantages such as simplistic device structure, high scalability, high operating speed, and low power consumption. RRAM devices leverage a reversible resistive switching (RS) effect of certain materials to realize information storage. For example, a conventional structure of an RRAM device comprises a metal-insulator-metal (MIM) structure in which the insulator layer comprises a resistive switching layer that is formed from a material (e.g., metal oxide) which exhibits a resistive switching behavior. For example, a RRAM device may exhibit bi-polar switching properties to switch between a high conductivity state (or low resistance state (LRS)) when a first voltage is applied to the RRAM device, and a low conductivity state (or high resistance state (HRS)) when a second voltage is applied to the RRAM device. In this regard, the two states, LRS and HRS, of the RRAM device are reversible based on the voltage applied thereto.

With RRAM devices, an "electroforming" process is performed to form a conductive filament in the metal-oxide layer, which serves as a switching element for the RRAM device. The electroforming process is performed on newly manufactured RRAM devices to initialize the resistive switching properties of the memory cells. In general, an electroforming process for a given resistive RRAM device comprises applying a voltage pulse to the memory cell at a given voltage level and for a given duration to form a conductive filament within the resistive switching layer (e.g., metal-oxide layer) of the RRAM device. The electroforming process will vary depending on the structural configuration and resistive materials of the RRAM device.

To achieve scalability of in RRAM arrays formed of filament-type RRAM devices, it is important to minimize or otherwise control the cycle-to-cycle and device-to-device fluctuation/variation in the resistive switching characteristics of the RRAM devices, which results in variations in the switching currents of RRAM devices across the RRAM array. The variation in switching currents introduces noise within the read currents that are processed by peripheral circuity utilized to control the RRAM array. The noise that is generated due to variations in the resistive switching characteristics of the RRAM devices increases and becomes more problematic with the scaling of RRAM arrays, which poses practical limits on RRAM scalability.

SUMMARY

Embodiments of the invention include methods for fabricating RRAM array structures which comprise RRAM memory cells that are formed of multiple parallel-connected resistive memory devices to reduce the effects of resistive switching variability of the RRAM memory cells. For example, one embodiment includes a method for fabricating a memory device. The method comprises: forming a stack structure on a substrate, wherein the stack structure comprises a plurality of insulating layers and horizontal electrode layers, wherein each horizontal electrode layer is disposed between two insulating layers in the stack structure; forming an array of vertical via structures which extend through the stack structure, wherein each vertical via structure comprises an inner metallic core, and an outer insulating layer which surrounds the inner metallic core, wherein the outer insulating layer comprises a metal-oxide material which exhibits a resistive switching behavior; wherein a resistive memory device is formed within the stack structure at each cross-point between the vertical via structures and the horizontal electrode layers, wherein the horizontal electrode layers and the inner metallic cores of the vertical via structures serve as device electrodes of the resistive memory devices, and wherein the outer insulating layers of the vertical via structures serve as resistive switching layers of the resistive memory devices; and forming upper metal lines on an upper surface of the stack structure, wherein each upper metal line is connected to a group of vertical via structures to form separate via groups and to define a three-dimensional (3D) array of resistive memory cells. Each resistive memory cell comprises a group of parallel-connected resistive memory devices which commonly share a given horizontal electrode layer and which are part of a same via group.

Another embodiment includes a memory device. The memory device comprises: a stack structure disposed on a substrate, wherein the stack structure comprises a plurality of insulating layers and horizontal electrode layers, wherein each horizontal electrode layer is disposed between two insulating layers in the stack structure; an array of vertical via structures which extend through the stack structure, wherein each vertical via structure comprises an inner metallic core, and an outer insulating layer which surrounds the inner metallic core, wherein the outer insulating layer comprises a metal-oxide material which exhibits a resistive switching behavior; wherein a resistive memory device is formed within the stack structure at each cross-point between the vertical via structures and the horizontal electrode layers, wherein the horizontal electrode layers and the inner metallic cores of the vertical via structures serve as device electrodes of the resistive memory devices, and wherein the outer insulating layers of the vertical via structures serve as resistive switching layers of the resistive memory devices; and upper metal lines disposed on an upper surface of the stack structure, wherein each upper metal line is connected to a group of vertical via structures to form separate via groups and to define a 3D array of resistive memory cells, wherein each resistive memory cell comprises a group of parallel-connected resistive memory devices which commonly share a given horizontal electrode layer and which are part of a same via group.

Other embodiments will be described in the following detailed description of embodiments, which is to be read in conjunction with the accompanying figures.

BRIEF DESCRIPTION OF THE DRAWINGS

FIGS. 5-9B schematically illustrate an exemplary process flow for fabricating a 3D RRAM crossbar array structure in which each RRAM memory cell is formed of multiple parallel-connected resistive memory devices to reduce the effects of resistive switching variability of the RRAM memory cells, according to an embodiment of the invention, wherein:

FIG. 5 is a schematic cross-sectional side view of a semiconductor device at an intermediate stage of fabrication in which a stack structure comprising a plurality of insulating layers and horizontal electrode layers for constructing a 3D RRAM crossbar array structure are formed on a substrate;

FIGS. 6A and 6B are schematic views of the semiconductor device shown in FIG. 5 after forming an array of vertical via openings which extend through the stack structure of insulating and horizontal electrode layers;

FIG. 7 is a schematic cross-sectional side view of the semiconductor device shown in FIG. 6A after forming a conformal layer of metal-oxide material and a conformal layer of conductive material on inner sidewall and bottom surfaces of the vertical via openings;

FIGS. 8A and 8B are schematic views of the semiconductor device shown in FIG. 7 after filling the vertical via openings with metallic material to form a plurality of vertical vias; and FIGS. 9A and 9B are schematic views of the semiconductor device shown in FIGS. 8A and 8B, respectively, after forming a plurality of upper metal lines to connect upper portions of the vertical vias and form via groups, wherein each via group comprises three vertical vias.

FIG. 10 schematically illustrates an alternate embodiment of the semiconductor device shown in FIGS. 9A and 9B, wherein a plurality of upper metal lines are formed to connect upper portions of vertical vias to form via groups, wherein each via group comprises six vertical vias.

DETAILED DESCRIPTION OF EMBODIMENTS

Figure 1:
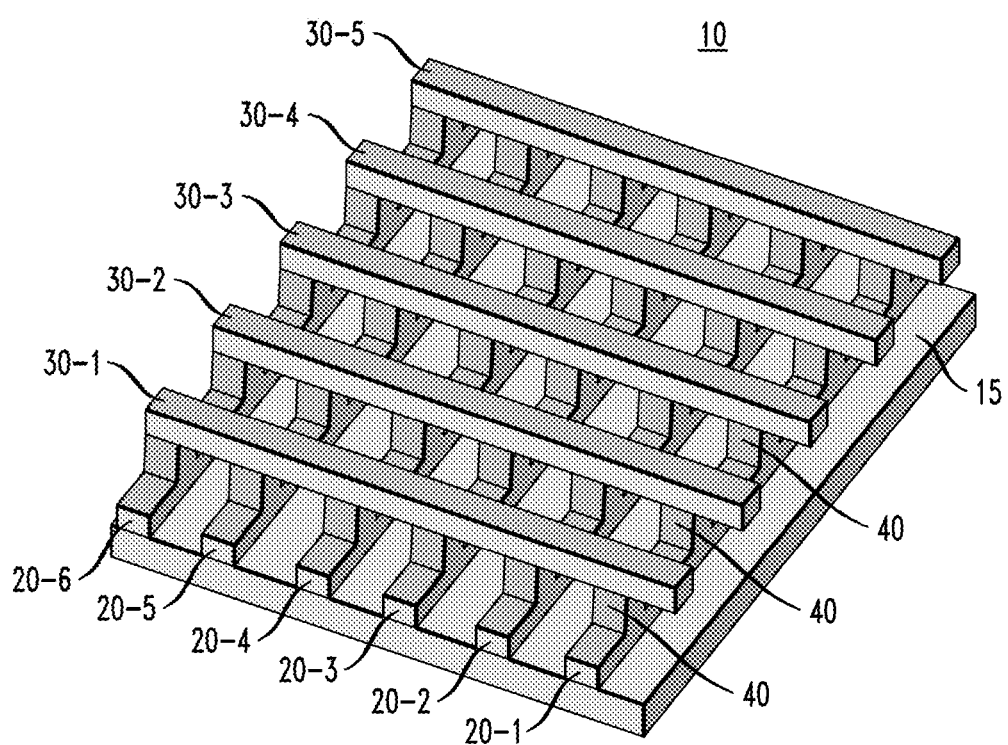
FIG. 1 is a perspective schematic view of a two-dimensional (2D) RRAM crossbar array structure which comprises an array of resistive memory devices.

Embodiments of the invention will now be discussed in further detail with regard to devices and methods for fabricating RRAM array structures which comprise RRAM memory cells, wherein each RRAM memory cell is formed of multiple parallel-connected resistive memory devices to reduce the effects of resistive switching variability in the RRAM memory cells. As explained in further detail below, RRAM crossbar array structures are designed to reduce the variability of switching characteristics of RRAM memory cells by leveraging an averaging effect on the resistivity of multiple RRAM devices connected in parallel.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

FIG. 1 is a perspective schematic view of a 2D RRAM crossbar array structure 10 which comprises an array of resistive memory devices. The RRAM crossbar array structure 10 comprises an interlevel dielectric layer (ILD) layer 15, a plurality of lower conductive lines 20-1, 20-2, 20-3, 20-4, 20-5, and 20-6 (collectively, lower conductive lines 20) formed on the ILD layer 15, a plurality of upper conductive lines 30-1, 30-2, 30-3, 30-4, and 30-5 (collectively, upper conductive lines 30), and resistive memory devices 40 disposed between cross-points (or intersections) of the lower and upper conductive lines 20 and 30. In one embodiment, the lower conductive lines 20 comprise word lines that are arranged in parallel to each other, and the upper conductive lines 30 comprise data/sense lines or bit lines that are arranged parallel to each other, wherein the lower conductive lines 20 and the upper conductive lines 30 are arranged orthogonal to each other. Each resistive memory device 40 can include a storage element (e.g., a resistive memory element) coupled (e.g., in series) to a selector device (e.g., an access device). The access device can be, for example, a diode or a transistor (e.g., a field effect transistor (FET)), or other types of access devices which are commonly used in RRAM arrays.

During operation, the resistive memory devices 40 of the RRAM array 10 can be programmed into one of two resistive states, e.g., LRS and HRS, by applying suitable programming signals to the resistive memory devices via the lower and upper conductive lines 20 and 30. A data access (or sensing) operation is used to determine the data state of a target resistive memory device 40 by sensing a current on a given upper conductive line 30 (e.g., bit line) connected to the target resistive memory device 40 in response to a read voltage applied to a selected lower conductive line 20 (e.g., word line) to which the target resistive memory device 40 is connected.

Figure 2:
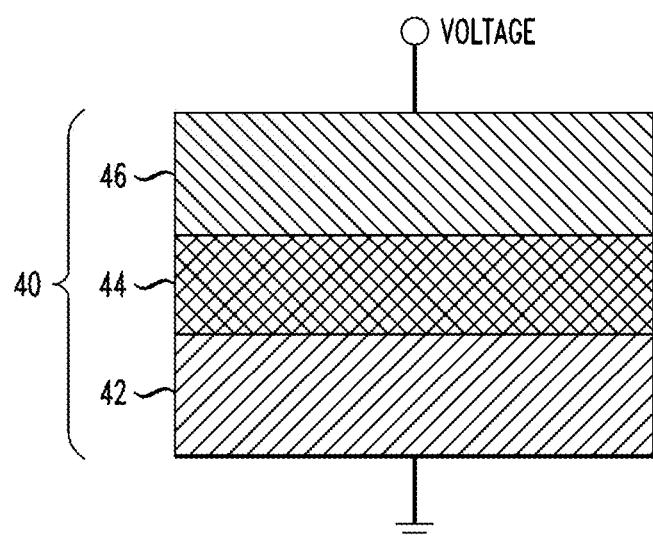
FIG. 2 schematically illustrates a structure of a resistive memory device which can be implemented in a RRAM crossbar array structure.

FIG. 2 schematically illustrates a structure of a resistive memory device 40 which can be implemented in the RRAM crossbar array structure 10 of FIG. 1. The resistive memory device 40 comprises a lower electrode 42, metal-oxide layer 44 (insulating layer), and an upper electrode 46. In one embodiment, the metal-oxide layer 44 is formed of a transition metal oxide material which serves as a programmable element (resistive switching layer) that has different resistance states (or different data states). Depending on the structural configuration, the resistive memory device 40 can be single level and/or multilevel RRAM memory device. In some conventional designs, a lower conductive line 20 in FIG. 1 serves as the lower electrode 42 and an upper conductive line 30 serves as the upper electrode of the resistive memory device 40.

Figure 3:
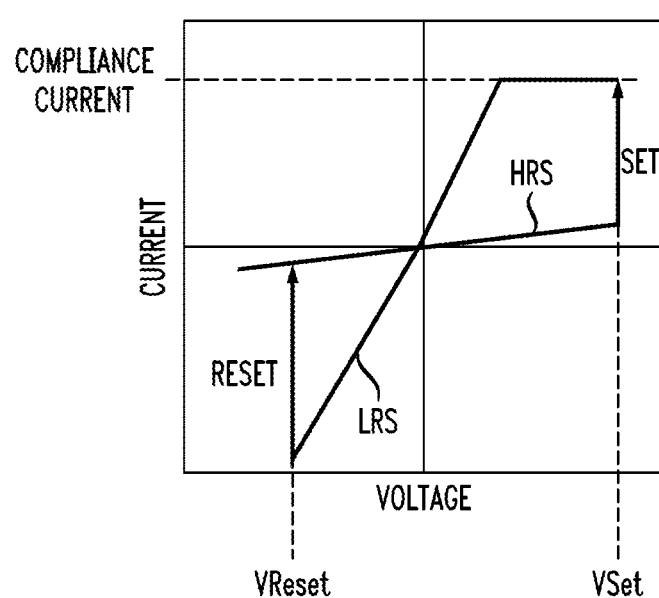
FIG. 3 graphically illustrates switching characteristics of a resistive memory device.

FIG. 3 graphically illustrates switching characteristics of a resistive memory device. In particular, FIG. 3 graphically illustrates a current/voltage relationship for a bi-polar resistive memory device (such as shown in FIG. 2) having an insulating layer (e.g., metal-oxide layer 44) which exhibits a switching behavior between a HRS and a LRS after an electroforming operation. The switching between the HRS and LRS states is controlled by a RESET voltage ($V_{Reset}$) and a SET voltage ($V_{Set}$), respectively. During a SET operation, the application of the $V_{Set}$ voltage across the electrodes 42 and 44 of the resistive memory device 40 results in the formation of one or more local conducting filaments in the metal-oxide layer 44 between the electrodes 42 and 46, causing the resistive memory device 40 to be switched (SET) to a low resistance state (LRS) or "on-state" with increased conductance. To transition to another state, a RESET operation is performed by applying a $V_{Reset}$ voltage across the electrodes 42 and 44 of the resistive memory device 40 to cause dissolution/disruption/rupture of the conductive filament(s), and switch the resistive memory device 40 to a high resistance state (HRS) or "off-state."

As graphically illustrated in FIG. 3, the resistive memory device 40 is "SET" by applying a $V_{Set}$ voltage to the resistive memory device 40 which is sufficient to reconnect a conductive filament in the metal-oxide layer 44 between the electrodes 42 and 46, and switch the resistive memory device 40 into the LRS state (or high conduction state). On the other hand, the resistive memory device 40 is "RESET" by applying a $V_{Reset}$ voltage to the resistive memory device 40 which is sufficient to disconnect the conductive filament in the metal-oxide layer 44 between the electrodes 42 and 46, and switch the resistive memory device 40 into the HRS state (or low conduction state). The "compliance current" represents a maximum level of current that can flow through the resistive memory device, which is limited by a current limiting device.

RRAM is considered as a promising technology for electronic synapse devices or memristor for neuromorphic computing as well as high-density and high-speed non-volatile memory application. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. In order to fabricate a large-scale RRAM crossbar array for such applications, each cross-point between the upper and lower conductive lines should have a high resistance (or low leakage current), otherwise the voltage drop across the upper conductive lines and across the lower conductive lines becomes significant.

Furthermore, as noted above, to achieve scalability of RRAM systems formed of filament-type RRAM devices, it is important to minimize or otherwise control the cycle-to-cycle and device-to-device fluctuation/variation in the resistive switching characteristics of the RRAM devices, which results in variations in the switching currents of RRAM devices across the RRAM array. Indeed, in a filament-type RRAM device, the formation and rupture of conductive filaments is stochastic by nature as the size and location of the conductive filaments formed during a SET process, and the extent of conductive filament rupture/dissolution during the RESET process can vary for a given RRAM device in different programming cycle or vary across different RRAM devices in the device array. The variation in switching currents introduces unwanted noise within the read currents that are processed by peripheral circuity utilized to control the RRAM array, and such unwanted noise increases with the scaling of 2D and 3D crossbar RRAM arrays. Embodiments of the invention provide RRAM structures which are designed to reduce the effects of the variability in resistive switching characteristics by forming RRAM memory cells which include multiple RRAM devices that are connected in parallel. The parallel connection of multiple RRAM devices serves as an averaging mechanism by which the total switching resistance of an RRAM memory cell is essentially equal to an average of the switching resistances of the parallel-connected RRAM devices of the RRAM memory cell.

Figure 4:
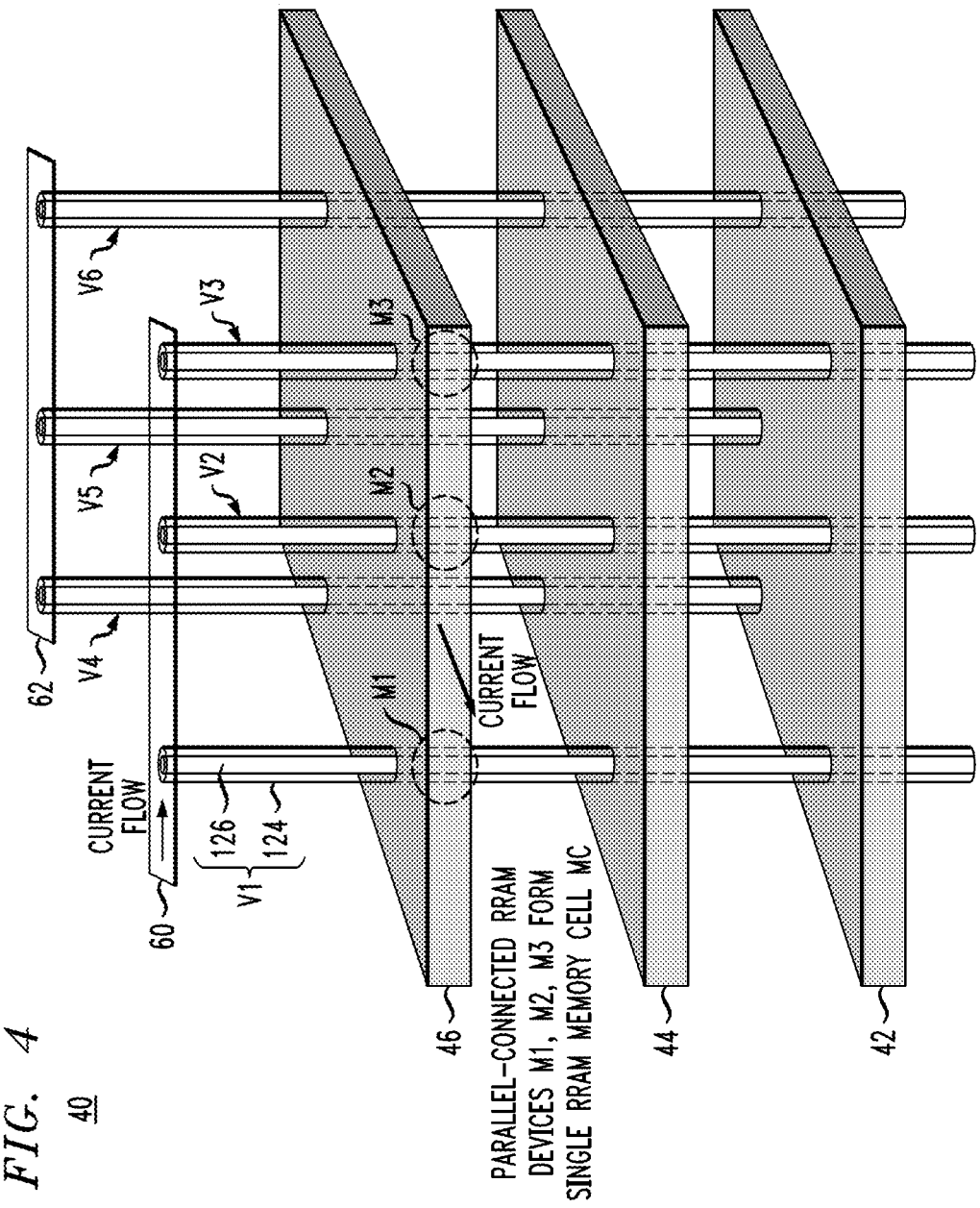
FIG. 4 is a perspective schematic view of a three-dimensional (3D) RRAM crossbar array structure which comprises RRAM memory cells wherein each RRAM memory cell is formed of multiple parallel-connected resistive memory devices to reduce the effects of resistive switching variability of the RRAM memory cells, according to an embodiment of the invention.

FIG. 4 is a perspective schematic view of a 3D RRAM crossbar array structure 40 which comprises RRAM memory cells wherein each RRAM memory cell is formed of multiple parallel-connected resistive memory devices to reduce the effects of resistive switching variability of the RRAM memory cells, according to an embodiment of the invention. In particular, the 3D RRAM crossbar array 40 comprises a plurality of horizontal metallic plates 42, 44, and 46 (or horizontal electrode layers), and a plurality of vertical vias V1, V2, V3, V4, V5, and V6. The horizontal metallic plates 42, 44, and 46 are formed of a metallic material such as titanium nitride (TiN), tungsten (W), copper (Cu), or other suitable metallic materials. Although not shown in FIG. 4 for ease of illustration, insulating layers are disposed between the horizontal metallic plates 42, 44, and 46. Each vertical via V1, V2, V3, V4, V5, and V6 comprises an outer insulating layer 124 (e.g., metal oxide layer) and an inner metallic core 126. In the exemplary 3D configuration of FIG. 4, a RRAM device is formed at each cross-point of a horizontal metallic plate and a vertical via.

For example, FIG. 4 schematically illustrates three RRAM devices M1, M2, and M3 which are formed at the cross-points of the horizontal metallic plate 46 and the vertical vias V1, V2 and V3, respectively. In this 3D configuration, the horizontal metallic plate 46 serves as a bottom electrode for each of the RRAM devices M1, M2 and M3, the insulating layers 124 of the vertical vias V1, V2 and V3 serve as the resistive switching layers (e.g., metal oxide layers) of the respective RRAM devices M1, M2 and M3, and the inner metallic cores 126 of the vertical vias V1, V2 and V3 serve as the upper electrodes of the respective RRAM devices M1, M2, and M3.

The insulating layers 124 of the vertical vias V1-V6 can be formed of a transition metal oxide such as hafnium oxide (e.g., $HfO_2$), tantalum oxide (e.g., $Ta_2O_5$), or other types of metal oxides which are commonly used to form RRAM devices. Each inner metallic core 126 can be formed of multiple layers of conductive material including, for example, a reactive electrode layer (e.g., TiN, or an aluminum-containing alloy) which serves as the upper electrode for the RRAM devices in contact with the insulating layer 124, and an inner layer of low resistivity metallic material (e.g., W), which serves as vertical metal line in the 3D crossbar array. For an illustrative comparison, in one embodiment, the horizontal metallic plates 42, 44, and 46 are functionally equivalent to bit lines in the 2D crossbar array 10 of FIG. 1, and the inner metallic cores 126 of the vertical vias V1, V2, V3, V4, V5, and V6 are functionally equivalent to word lines in the 2D crossbar array 10 of FIG. 1. In another embodiment, the horizontal metallic plates 42, 44, and 46 are utilized are word lines, and the inner metallic cores 126 of the vertical vias V1-V6 are utilized as bit lines.

As further shown in FIG. 4, the upper portions of the vertical vias V1 and V2, and V3 are commonly connected to an upper metal line 60, and the upper portions of the vertical vias V4, V5, and V6 are commonly connected to an upper metal line 62. The vertical vias V1, V2, V3, V4, V5, and V6 are commonly connected to each of the horizontal metallic plates 42, 44 and 46. In this regard, the vertical vias V1, V2, and V3 are connected in parallel (forming a first via group) and the vertical vias V4, V5, and V6 are connected in parallel (forming a second via group). The separate via groups serve to define a 3D array of RRAM memory cells, wherein each RRAM memory cell comprises a group of parallel-connected RRAM device devices which commonly share a given horizontal electrode layer and which are part of a same via group.

In particular, in this configuration shown in FIG. 4, the RRAM devices M1, M2, and M3 (which are formed at the cross-points of the horizontal metallic plate 46 and respective vertical vias V1, V2, and V3) are effectively connected in parallel, thereby collectively forming a single RRAM memory cell (MC). Similarly, the RRAM devices which are formed at the cross-points of the horizontal metallic plate 44 and respective vertical vias V1, V2 and V3 are effectively connected in parallel (and collectively form a single RRAM memory cell), and the RRAM devices which are formed at the cross-points of the horizontal metallic plate 42 and respective vertical vias V1, V2, and V3 are effectively connected in parallel (and collectively form a single RRAM memory cell). The same concept applies to the vertical via group V4, V5, and V6. In particular, the RRAM devices which are formed at the cross-points of the horizontal metallic plate 46 and respective vertical vias V4, V5, and V6 are effectively connected in parallel (and collectively form a single RRAM memory cell), the RRAM devices which are formed at the cross-points of the horizontal metallic plate 44 and respective vertical vias V4, V5, and V6 are effectively connected in parallel (and collectively form a single RRAM memory cell), and the RRAM devices which are formed at the cross-points of the horizontal metallic plate 42 and respective vertical vias V4, V5, and V6 are effectively connected in parallel (and collectively form a single RRAM memory cell).

The RRAM devices M1, M2, and M3 that form the single RRAM memory cell (MC) have respective switching resistances R1, R2, and R3, which are connected in parallel. In this manner, the total effective resistance ($R_{EFF}$) of the RRAM memory cell (MC) formed by the parallel-connected RRAM devices M1, M2, and M3 is determined as $$R_{EFF} = \frac{1}{\left(\frac{1}{R1}\right)+\left(\frac{1}{R2}\right)+\left(\frac{1}{R3}\right)}.$$

The parallel connection of the RRAM devices M1, M2 and M3 provides a mechanism for averaging the switching resistivity of the parallel-connected RRAM devices M1, M2 and M3 within the via group, which minimizes the variability of the switching resistance of RRAM memory cell (MC), as compared to an embodiment in which each individual RRAM device M1, M2, and M3 is configured as a separate RRAM memory cell. The averaging effect is built in by simply measuring the total current flow (through the upper metal line 60 and the horizontal metallic plate 46, as shown by the current flow arrows in FIG. 4) which is generated when a read voltage is applied across the upper metal line 60 and the horizontal metallic plate 46.

It is to be understood that while FIG. 4 schematically illustrates six (6) vertical vias and three (3) horizontal plates 42, 44, and 46 for ease of illustration, the 3D RRAM crossbar array 40 would include more than 6 vertical vias and could include more than 3 horizontal electrode plates, depending on the desired size of the 3D RRAM crossbar array. In addition, while FIG. 4 illustrates via groups formed of three parallel-connected vias, in other embodiments, via groups can be formed with more than three parallel-connected vias, depending on the desired configuration and application.

Various methods for fabricating a 3D RRAM crossbar array (such as shown in FIG. 4) will now be described in further detail with reference to FIGS. 5-10. For example, FIGS. 5-9B schematically illustrate an exemplary process flow for fabricating a 3D RRAM crossbar array according to an embodiment of the invention. FIG. 5 is a schematic cross-sectional side view of a semiconductor device 100 at an intermediate stage of fabrication in which a stack structure comprising a plurality of insulating layers and horizontal electrode layers for constructing a 3D RRAM crossbar array structure is formed on a substrate 105. A metallization layer 110 is formed on a surface of the substrate 105. The stack structure comprises a plurality of insulating layers 120-1, 120-2, and 120-3 (collectively referred to as insulating layers 120), and a plurality of horizontal electrode layers 130-1 and 130-2 (collectively referred to as horizontal electrode layers 130), wherein each horizontal electrode layer 130 is disposed between two insulating layers 120 in the stack structure.

While the substrate 105 is generically depicted in FIG. 1, in one embodiment, the substrate 105 would comprise various layers including, for example, a base semiconductor substrate (e.g., semiconductor wafer), a front-end-of-line (FEOL) layer formed on the base semiconductor substrate, a middle-of-line (MOL) structure, and one or more initial layers of a back-end-of-line (BEOL) structure. For example, in one embodiment, base semiconductor substrate may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V). Non-limiting examples of compound semiconductor materials include gallium arsenide, indium arsenide, and indium phosphide.

In another embodiment, the base semiconductor substrate may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of the FEOL layer. In the example embodiment, the FEOL layer would comprise the active circuitry (e.g., word line select circuitry, data/bit line sensing circuitry, electroforming circuitry, etc.) to control operation of the RRAM crossbar array, and to control electroforming of the resistive memory cells of the RRAM crossbar array.

The MOL layer would comprise one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals of the integrated circuitry of the FEOL layer. The conductive via contacts of the MOL layer provide electrical connections between the integrated circuitry of the FEOL layer and a first level of metallization of the BEOL structure.

As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In one embodiment, a 3D RRAM crossbar array structure is integrally formed in the BEOL layer using a BEOL fabrication process flow which includes the methods schematically shown in FIGS. 5-9B. In this regard, the stack structure of insulating layers 120 and horizontal electrode layers 130 shown in FIG. 5 would be formed by depositing and pattering layers of conductive and insulating material as part of the BEOL process. The 3D RRAM crossbar array structure would be connected to devices in the FEOL layer using a network of electrical connections formed in the BEOL and MOL layers. The metallization layer 110 shown in FIG. 5 generically represents a pattern of metallic wiring and contact pads that can be formed as part of a given metallization layer of the BEOL interconnect structure. In particular, the metallization layer 110 is formed by depositing a layer of metallic material on an upper surface of the substrate 105, and then patterned to form metal line patterns and contact pads, which are needed for the given device configuration and layout. The metallization layer 110 may be formed of a low resistively metallic material such as Cu, W, aluminum (Al) or other suitable metallic materials that are typically utilized in BEOL structures.

The horizontal electrode layers 130-1 and 130-2 can be formed of a metallic material such as TiN, or any other metallic material which is suitable for the given application. For an illustrative comparison, in one embodiment, the horizontal electrode layers 130-1 and 130-2 are functionally equivalent to the horizontal metal plates 44 and 46 shown in FIG. 4, which serve as bottom electrodes for RRAM devices to be formed, as well as bit lines for the 3D RRAM crossbar array structure. In some embodiments, as shown in FIG. 5, the insulating layers 120-1, 120-2, and 120-3 comprise multilayer stack structures which are formed of a first insulating layer 122, a second insulating layer 124, and a third insulating layer 126. In one embodiment, the second insulating layer 124 is formed of a low dielectric constant (low-k) insulating material such as silicon oxide (e.g., $SiO_2$) to minimize the parasitic capacitances between adjacent metallic layers 110, 130-1, and 130-2, for example. The first and third insulating layers 122 and 126 are formed of a thin layer of insulating material such as silicon nitride (SiN), which serve as barrier diffusion layers to prevent diffusion of oxygen in the silicon oxide insulating material layers 130-1 and 130-2 from diffusing into and oxidizing the metallic material of the metallic layers 110, 130-1, and 130-2.

Figure 6B:
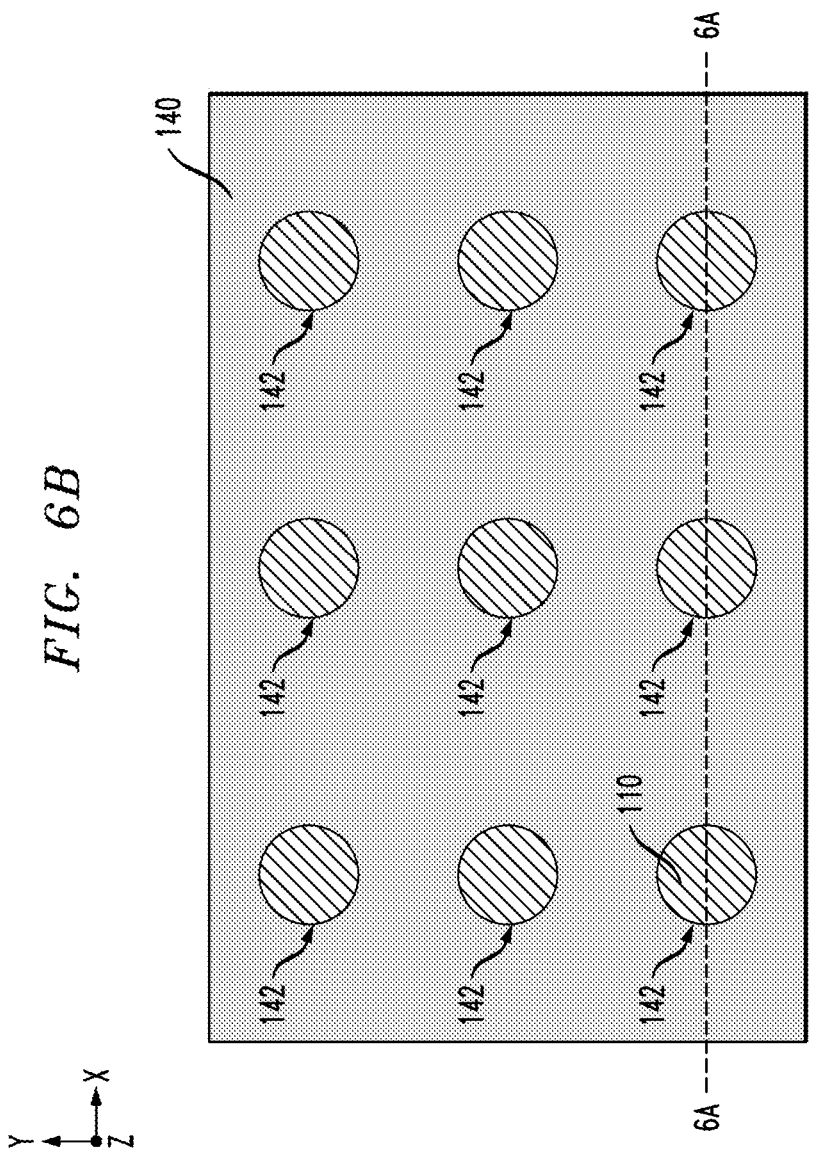

Next, FIGS. 6A and 6B are schematic views of the semiconductor device shown in FIG. 5 after forming an array of vertical via openings 142 which extend through the stack structure of insulating and horizontal electrode layers 120 and 130 down to the lower metallization layer 110. FIG. 6A is a schematic cross-sectional side view of the semiconductor device shown in FIG. 5 after forming the array of via openings 142, and FIG. 6B is a top plan view of the semiconductor device shown in FIG. 6A. It is to be further noted that FIG. 6A is a cross-sectional view of the semiconductor structure of FIG. 6B along line 6A-6A shown in FIG. 6B.

In one embodiment, the array of vertical via openings 142 is formed by depositing and patterning a layer of hard mask material to form a hard mask 140 with an image that defines a pattern of the vertical via openings 142 to be etched through the stack structure of layers 120 and 130. The stack structure of layers 120 and 130 can be etched away using one or more sequential directional dry etch processes (e.g., reactive ion etch (RIE) process) having etch chemistries that are configured to etch the materials forming the stack of layers 120 and 130. As shown in FIG. 6B, the vertical via openings 142 comprise circular-shaped openings that are etched through the stack of layers 120 and 130 down to the lower metallization layer 110. While only nine (9) vertical via openings 142 are shown in FIG. 6B for ease of illustration, the 3D RRAM crossbar array structure would comprise more than nine vertical via structures.

Figure 7:
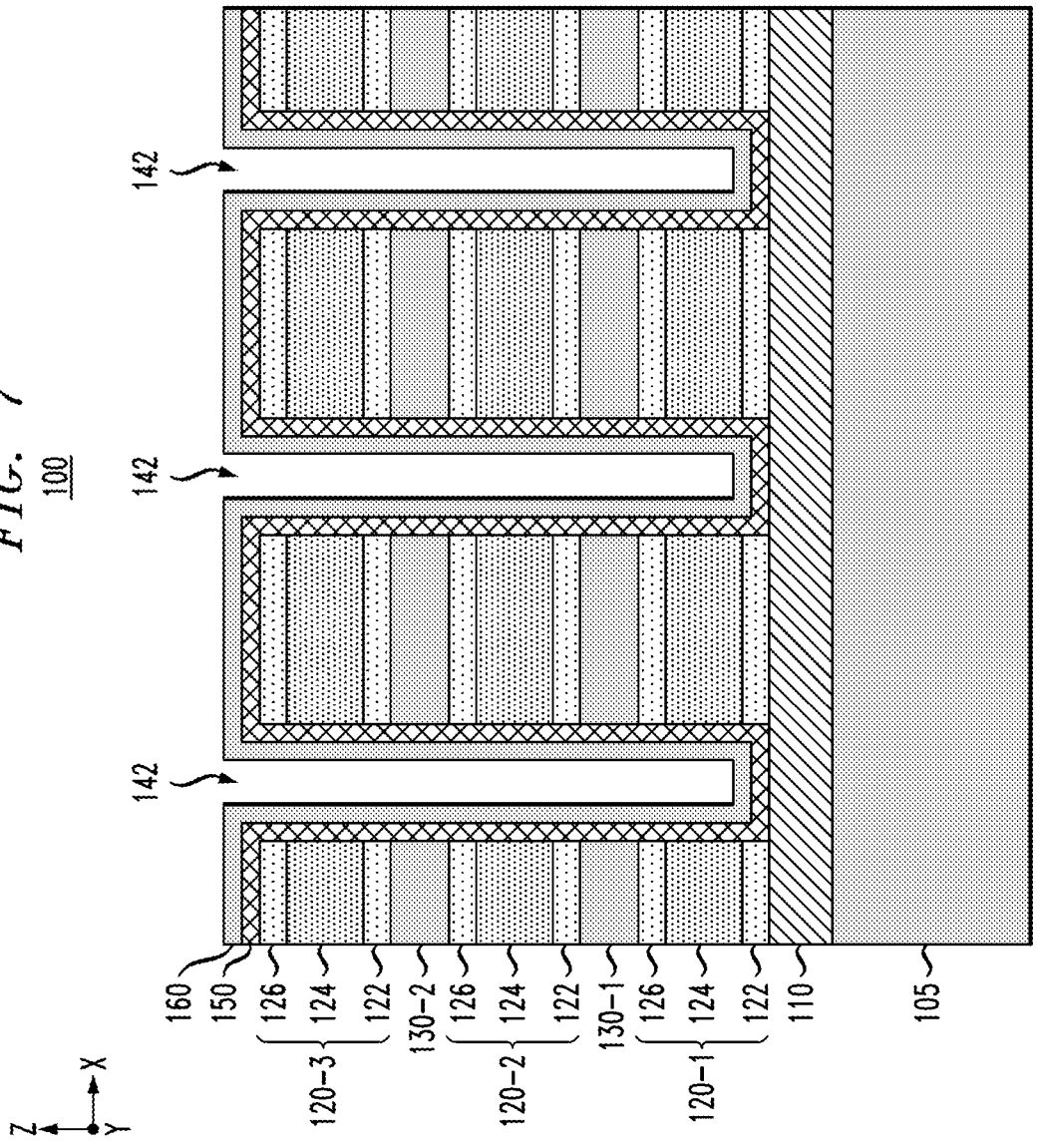

Next, FIG. 7 is a schematic cross-sectional side view of the semiconductor device shown in FIG. 6A after forming a conformal layer of metal-oxide material 150 and a conformal layer of conductive material 160 on inner sidewall and bottom surfaces of the vertical via openings 142. The semiconductor structure shown in FIG. 7 is formed by removing the hard mask 140, and sequentially depositing the conformal layer of metal-oxide material 150 and the conformal layer of conductive material 160 over the surface of the semiconductor structure and the sidewall surfaces of the vertical via openings 142. The conformal layer of metal-oxide material 150 on the sidewall surfaces of the vertical via openings 142 makes contact with the exposed sidewall surfaces of the horizontal electrode layers 130-1 and 130-2 within the vertical via openings 142. The conformal metal oxide layer 150 serves as the resistive switching layers for the RRAM devices, and the conformal layer of conductive material 160 serves as a reactive electrode for the RRAM devices.

The conformal metal-oxide layer 150 can be formed of any type of metal-oxide material which is suitable for the given application including, but not limited to, hafnium oxide, tantalum oxide, nickel oxide, titanium oxide, zirconium oxide, zinc oxide, tungsten oxide, aluminum oxide, molybdenum oxide, copper oxide, etc. The conformal layer of conductive material 160 can be formed of TiN, a multilayer stack of TiN/TiC/TiN, an Al-containing alloy, or other metallic materials that are suitable to serve as reactive electrodes for RRAM devices for the given application. The conformal layers 150 and 160 can be formed using suitable deposition methods which allow for high-conformality deposition of the materials, such as ALD (atomic layer deposition), CVD (chemical vapor deposition) PECVD (plasma-enhanced CVD), or PVD (physical vapor deposition).

Figure 8B:
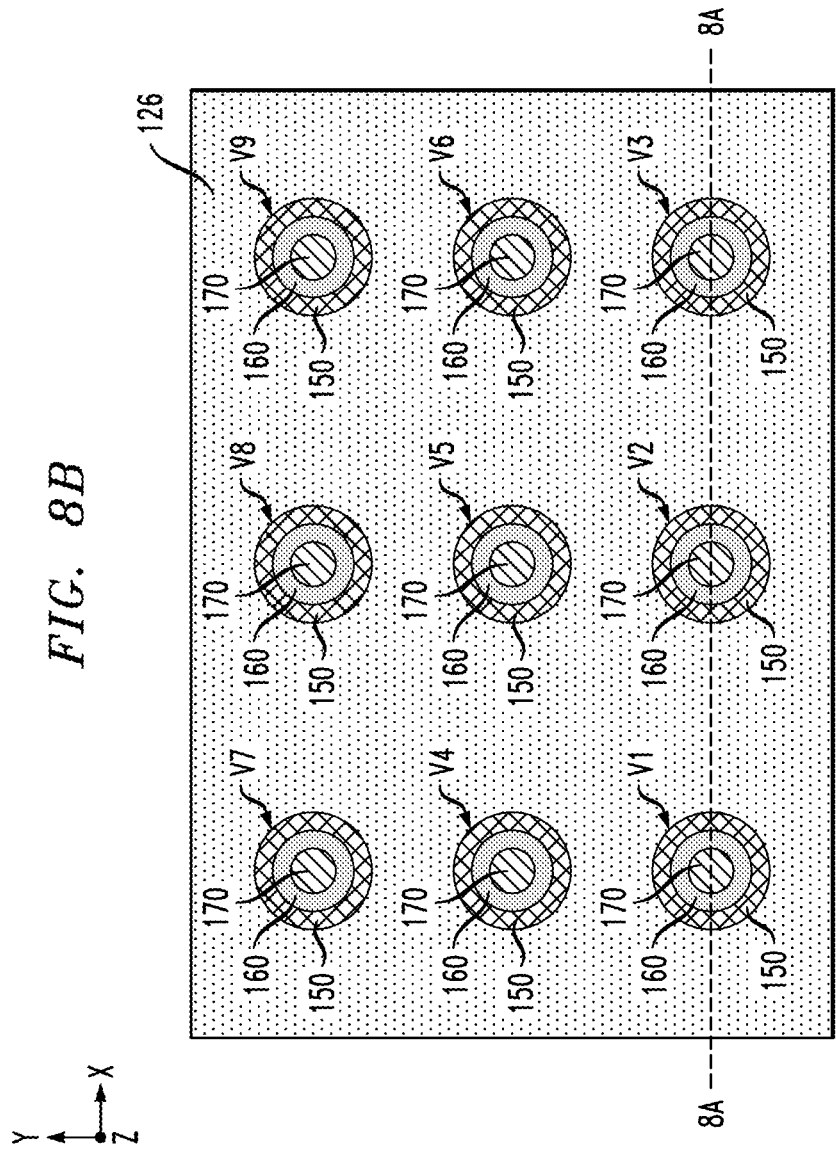

Next, FIGS. 8A and 8B are schematic views of the semiconductor device shown in FIG. 7 after filling the vertical via openings 142 with metallic material to form a plurality of vertical vias. In one embodiment, the semiconductor structure shown in FIGS. 8A and 8B can be formed by depositing a layer of metallic material to fill the vertical via openings 142 with metallic material 170, and performing a planarizing process to remove overburden portions of the conformal layers 150 and 160 and the layer of metallic material down to an upper surface of the insulating layer 120-3. FIG. 8A is a schematic cross-sectional side view of the semiconductor device shown in FIG. 7 after completing of the planarizing process, and FIG. 8B is a top plan view of the semiconductor device shown in FIG. 8A. It is to be further noted that FIG. 8A is a cross-sectional view of the semiconductor structure of FIG. 8B along line 8A-8A shown in FIG. 8B.

The vertical via openings 142 in FIG. 7 are filled with the metallic material 170 by depositing a layer of low-resistivity metallic material such as W or Cu to fill the vertical via openings 142, followed by a chemical-mechanical polish (CMP) process to remove the overburden portions of the metallic material and conformal layers 150 and 160 disposed on the upper surface of the insulating layer 120-3. As shown in FIGS. 8A and 8B, the resulting structure comprises an array of vertical vias V1, V2, V3, V4, V5, V6, V7, V8, and V9 formed within, and extending through the stack of layers (120-1/130-1/120-2/130-2/120-3) from a top surface to a bottom of the stack structure. In the example embodiment of FIGS. 8A and 8B, the metallic material 170 forms an inner core of each of the vertical vias V1, V2, V3, V4, V5, V6, V7, V8, and V9, wherein the inner cores 170 serve as low-resistance word lines or bit lines of the 3D RRAM structure 100.

In the example embodiment of FIGS. 8A and 8B, a single RRAM device is formed at each cross-point between each vertical via V1~V9 and the horizontal electrode layers 130-1 and 130-2, wherein each RRAM device comprises (i) a first (reactive) electrode formed by portion of the conformal layer of conductive material 160, (ii) a resistive switching layer formed by a portion of the conformal metal-oxide layer 150, and (iii) a second electrode formed by one of the horizontal electrode layers 130-1 and 130-2 surrounding the vertical vias V1~V9. In this regard, the example embodiment shown in FIGS. 8A and 8B comprises eighteen (18) individual RRAM devices, wherein each vertical via V1~V9 comprises two (2) RRAM devices—one at each region of the vertical via which intersects the horizontal electrode layers 130-1 and 130-2.

Figure 9A:
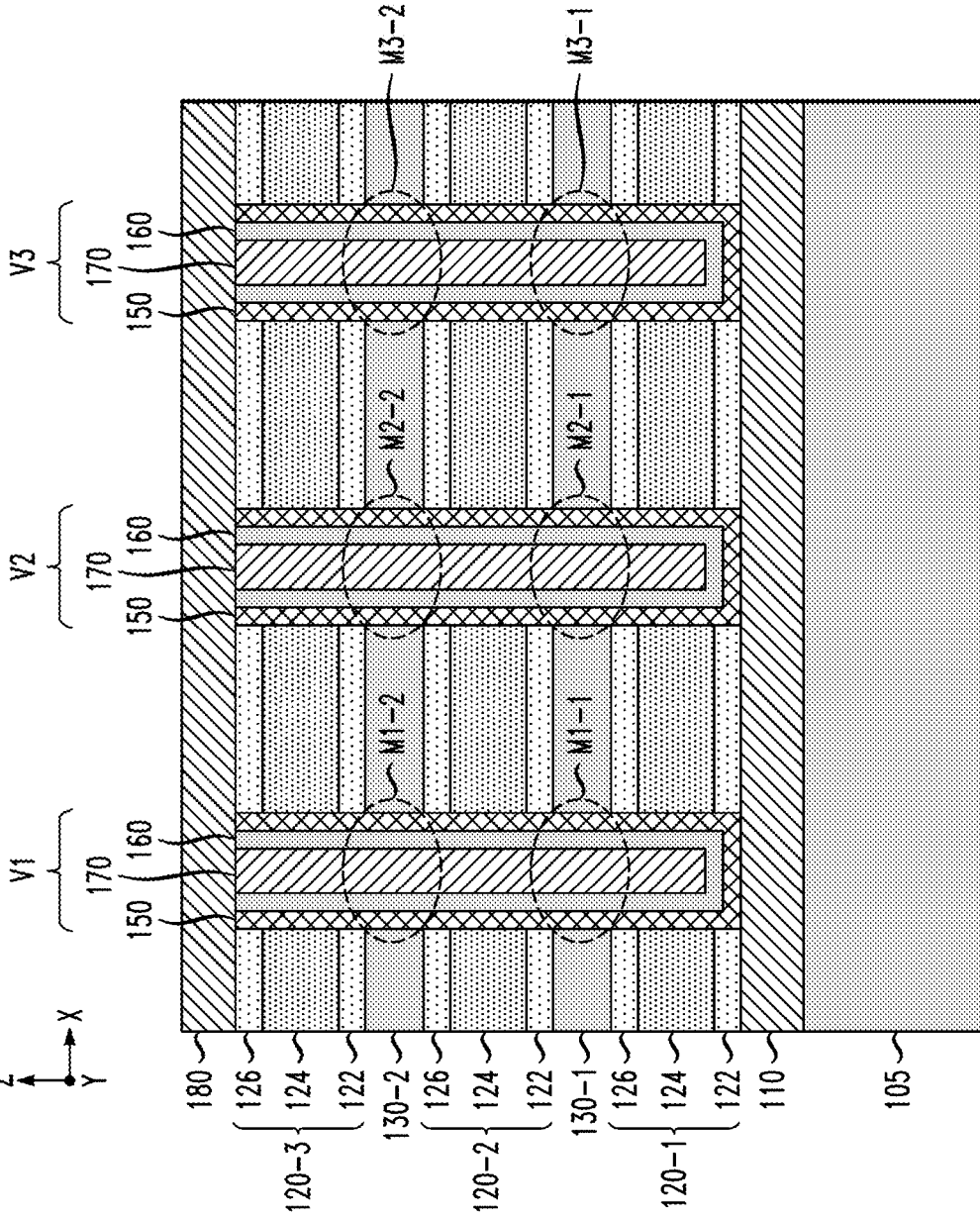
Figure 9B:
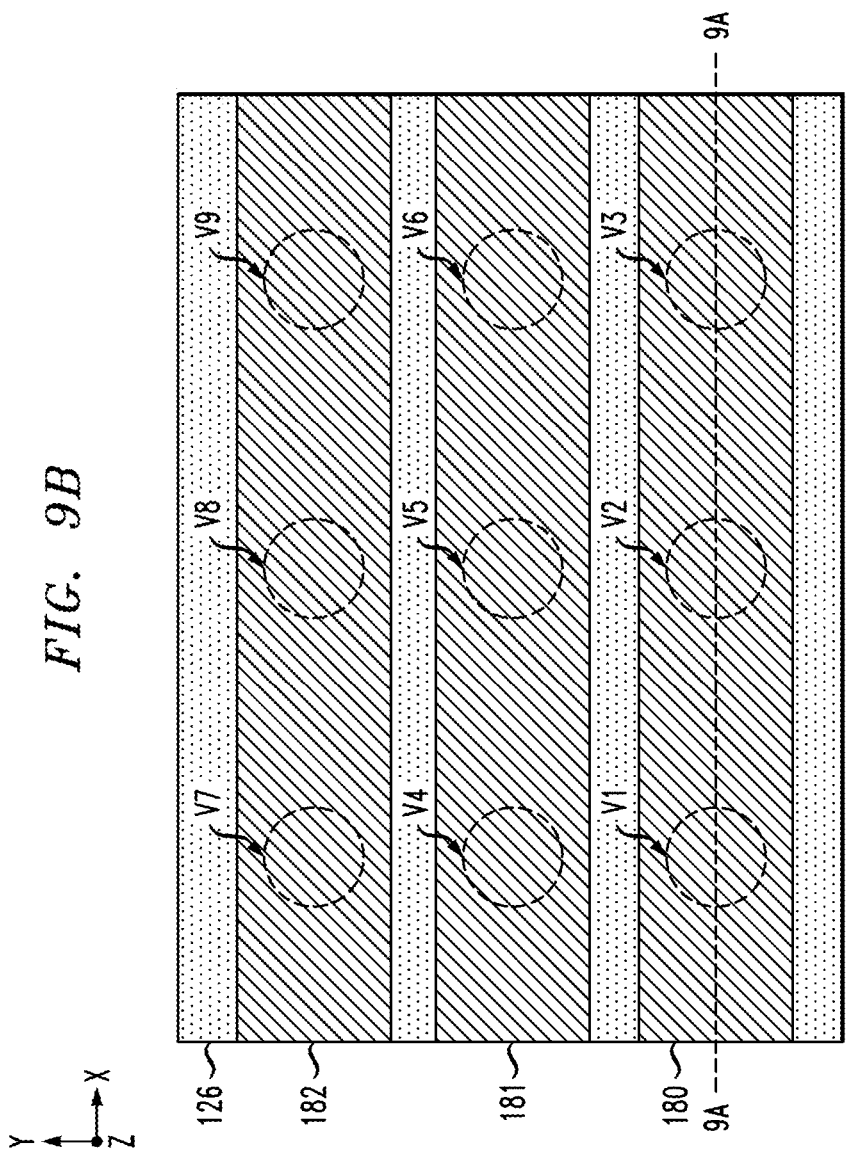

A next stage in the fabrication process comprises forming an upper metallization layer with metallic lines or plates which are designed to connect upper portions of selected vertical vias V1~V9 to form vertical via groups. For example, FIGS. 9A and 9B are schematic views of the semiconductor device shown in FIGS. 8A and 8B, respectively, after forming a plurality of metal lines 180, 181, and 182 to connect upper portions of the vertical vias and form via groups. FIG. 9B is a top plan view of the semiconductor device shown in FIG. 9A, and FIG. 9A is a cross-sectional view of the semiconductor structure of FIG. 9B along line 9A-9A shown in FIG. 9B.

As shown in FIGS. 9A and 9B, the metal lines comprise a first metal line 180, a second metal line 181, and a third metal line 182. The first metal line 180 connects the upper portions of the vertical vias V1, V2 and V3 to form a first vertical via group. The second metal line 181 connects the upper portions of the vertical vias V4, V5 and V6 to form a second vertical via group. The third metal line 182 connects the upper portions of the vertical vias V7, V8 and V9 to form a third vertical via group. The metal lines 180, 181, and 182 can be formed by depositing a layer of metallic material (e.g., Cu) on the planarized surface of the semiconductor structure (shown in FIGS. 8A and 8B), and then patterning the layer of metallic material to form the metal lines 180, 181, and 182 (and other desired metallization patterns as needed for the give application). The metal deposition and patterning processes can be performed using known deposition and patterning techniques. The metal lines 180, 182, and 182 are preferably formed of a metallic material with low-resistivity to minimize voltage drop across along relatively long conductive lines of a large RRAM crossbar array structure (e.g., 100×100 resistive memory cell array).

As depicted in FIG. 9A, the upper first metal line 180 and the horizontal electrode layers 130-1 and 130-2 serve to electrically connect the vertical vias V1, V2, and V3 into a group of parallel-connected vias. The vertical via V1 comprises first and second RRAM devices M1-1 and M1-2, which are formed at the cross-points of the vertical via V1 and the horizontal electrode layers 130-1 and 130-2, respectively. The vertical via V2 comprises first and second RRAM devices M2-1 and M2-2, which are formed at the cross-points of the vertical via V2 and the horizontal electrode layers 130-1 and 130-2, respectively. The vertical via V3 comprises first and second RRAM devices M3-1 and M3-2, which are formed at the cross-points of the vertical via V3 and the horizontal electrode layers 130-1 and 130-2, respectively. In the example embodiment of FIG. 9A, the RRAM devices M1-1, M2-1 and M3-1 (which commonly utilize/share the horizontal electrode layer 130-1 as a bottom electrode) comprise a group of parallel-connected RRAM devices that form a single RRAM memory cell. Similarly, the RRAM devices M1-2, M2-2 and M3-2 (which commonly utilize/share the horizontal electrode layer 130-2 as a bottom electrode) comprise a group of parallel-connected RRAM devices that form a single RRAM memory cell.

In a similar manner, the upper second metal line 181 and the horizontal electrode layers 130-1 and 130-2 serve to electrically connect the vertical vias V4, V5, and V6 into a group of parallel-connected vias, and the upper third metal line 182 and the horizontal electrode layers 130-1 and 130-2 serve to electrically connect the vertical vias V7, V8, and V9 into a group of parallel-connected vias. Each of the vertical vias V4, V5, V6, V7, V8, and V9 comprise first and second RRAM devices, which are formed at the cross-points of the vertical via and the horizontal electrode layers 130-1 and 130-2. In this regard, each group of RRAM devices which commonly utilize/share a given horizontal electrode layer 130-1 or 130-2 as a bottom electrode, and which are part of a same vertical via group, form a single RRAM memory cell in the 3D RRAM crossbar array structure 100. In one embodiment, the horizontal electrode layers 130-1 and 130-2 are utilized as bit lines, and the vertical vias V1~V9 and metal lines 180, 181 and 182 are utilized as word lines. In another embodiment, the horizontal electrode layers 130-1 and 130-2 are utilized as word lines, and the vertical vias V1~V9 and metal lines 180, 181 and 182 are utilized as bit lines.

While FIGS. 9A and 9B depict an exemplary embodiment in which each via group comprises three vertical via structures, it is to be understood that via groups can be formed with more than three vertical via structures. For example, FIG. 10 schematically illustrates an alternate embodiment of the 3D RRAM crossbar array structure shown in FIGS. 9A and 9B, wherein the upper metallization layer comprises first and second metallic lines 190 and 191, wherein each of the first and second metallic lines 190 and 191 commonly connect to upper portions of six (6) vertical vias. In particular, as shown in FIG. 10, the first metal line 190 is formed to commonly connect the upper portions of vertical vias V1, V2, V3, V4, V5, and V6, and the second metal line 191 is formed to commonly connect the upper portions of vertical vias V7, V8, V9, V10, V11, and V12. In this vertical via group configuration, each RRAM memory cell comprises a group of six (6) parallel-connected RRAM devices. While each vertical via group can be formed with any number of parallel-connected vias, in some embodiments, it is preferable for each via group to include an equal number of vias so that the same averaging effect can be realized for each via group.

While not specifically shown in FIG. 9A, 9B, or 10, each horizontal electrode layer 130-1, and 130-2, and each upper metal line 180, 181, 182, 190 and 191 would be extended to a peripheral region of the 3D RRAM crossbar array structure 100, and connected to peripheral circuitry formed in the underlying FEOL layer using a network of wiring and vertical via structures formed within the BEOL interconnect structure.

It is to be understood that the methods discussed herein can be incorporated in various semiconductor process flows to fabricate RRAM crossbar array structures (or other memory arrays which comprise resistive memory cells), in conjunction with integrated circuits having analog and digital circuitry or mixed-signal circuitry. In particular, integrated circuit dies can be fabricated with various devices such as FinFET devices, bipolar transistors, metal-oxide-semiconductor transistors, diodes, capacitors, inductors, etc. An integrated circuit can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques described herein according to embodiments of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A memory device, comprising:
    a stack structure disposed on a substrate, wherein the stack structure comprises a plurality of insulating layers and horizontal electrode layers, wherein each horizontal electrode layer is disposed between two insulating layers in the stack structure;
    an array of vertical via structures which extend through the stack structure, wherein each vertical via structure comprises an inner metallic core, and an outer insulating layer which surrounds the inner metallic core, wherein the outer insulating layer comprises a metal-oxide material which exhibits a resistive switching behavior;
    wherein a resistive memory device is formed within the stack structure at each cross-point between the vertical via structures and the horizontal electrode layers, wherein the horizontal electrode layers and the inner metallic cores of the vertical via structures serve as device electrodes of the resistive memory devices, and wherein the outer insulating layers of the vertical via structures serve as resistive switching layers of the resistive memory devices; and
    upper metal lines disposed on an upper surface of the stack structure, wherein each upper metal line is connected a group of vertical via structures to form separate via groups and to define a three-dimensional (3D) array of resistive memory cells;
    wherein each resistive memory cell comprises a group of parallel-connected resistive memory devices which commonly share a given horizontal electrode layer and which are part of a same via group.

2. The memory device of claim 1, wherein each resistive memory cell in the 3D array of resistive memory cells comprises a same number of parallel-connected resistive memory devices.

3. The memory device of claim 1, wherein the metal-oxide material comprises a transition metal-oxide material including at least one of hafnium oxide and tantalum oxide.

4. The memory device of claim 1, wherein the inner metallic cores of the vertical via structures each comprise a multilayer core structure comprising a first layer of conductive material surrounding a second layer of conductive material, wherein the first layer of conductive material serves as a reactive electrode for the resistive memory devices, wherein the second layer of conductive material comprises a low-resistivity metallic material which serves as word line of the 3D array of resistive memory cells, and wherein the horizontal electrode layers serve as bit lines of the 3D array of resistive memory cells.

5. The memory device of claim 4, wherein the first layer of conductive material of the multi-layer core structure comprises one of titanium nitride and an aluminum-containing alloy, and wherein the second layer of conductive material comprises one of copper and tungsten.

6. The memory device of claim 1, wherein the stack structure is integrally formed within a back-end-of-line (BEOL) interconnect structure.

7. The memory device of claim 1, wherein the horizontal electrode layers of the stack structure comprise one of titanium nitride, tungsten and copper.

8. The memory device of claim 1, wherein the upper metal lines comprise one of copper, tungsten, and aluminum.

9. The memory device of claim 1, wherein each of the insulating layers of the stack structure comprises a multi-layer insulating stack structure comprising a low-k dielectric insulating layer disposed between diffusion barrier layers.

10. The memory device of claim 9, wherein the low-k dielectric insulating layer comprises silicon oxide and wherein the diffusion barrier layers comprise silicon nitride films.

11. The memory device of claim 1, wherein each of the upper metal lines is connected to a same number of vertical via structures such that each via group comprises the same number of vertical via structures.

12. The memory device of claim 1, wherein the memory device comprises a 3D resistive random-access memory (RRAM) crossbar array.

13. A memory device, comprising:
a stack structure comprising horizontal electrode layers separated by insulating layers;
a plurality of vertical via structures which extend through the stack structure, wherein each vertical via structure comprises an inner metallic core, and an outer layer which surrounds the inner metallic core, wherein the outer layer comprises a material which exhibits a resistive switching behavior;
wherein a resistive memory device is disposed each cross-point between the vertical via structures and the horizontal electrode layers, wherein the horizontal electrode layers and the inner metallic cores of the vertical via structures serve as device electrodes of the resistive memory devices, and wherein the outer layers of the vertical via structures serve as resistive switching layers of the resistive memory devices; and
upper metal lines disposed on an upper surface of the stack structure, wherein each upper metal line is connected to a separate group of vertical via structures to thereby form separate vertical via groups and to thereby define a three-dimensional (3D) array of resistive memory cells;
wherein each resistive memory cell comprises a group of parallel-connected resistive memory devices which intersect a same horizontal electrode layer and which are commonly connected to a same one of the upper metal lines;
wherein each group of parallel-connected resistive memory devices is configured to function as a single resistive memory cell having a total switching resistance equal to an average of switching resistances of the parallel-connected resistive memory devices that form the single resistive memory cell.

14. The memory device of claim 13, wherein each resistive memory cell in the 3D array of resistive memory cells comprises a same number of parallel-connected resistive memory devices.

15. The memory device of claim 13, wherein the outer layer of the vertical via structures comprises a metal-oxide material.

16. The memory device of claim 13, wherein the inner metallic cores of the vertical via structures each comprise a multilayer core structure comprising a first layer of conductive material surrounding a second layer of conductive material, wherein the first layer of conductive material serves as a reactive electrode for the resistive memory devices, wherein the second layer of conductive material comprises a low-resistivity metallic material.

17. The memory device of claim 16, wherein the first layer of conductive material of the multi-layer core structure comprises one of titanium nitride and an aluminum-containing alloy, and wherein the second layer of conductive material comprises one of copper and tungsten.

18. The memory device of claim 13 wherein the horizontal electrode layers of the stack structure comprise one of titanium nitride, tungsten and copper, and wherein the upper metal lines comprise one of copper, tungsten, and aluminum.

19. The memory device of claim 13, wherein each of the insulating layers of the stack structure comprises a multilayer insulating stack structure comprising a low-k dielectric insulating layer disposed between diffusion barrier layers.

20. The memory device of claim 13, wherein each of the upper metal lines is connected to a same number of vertical via structures such that each via group comprises the same number of vertical via structures.

* * * * *